(12) United States Patent
Choi et al.

(10) Patent No.: US 7,101,804 B2
(45) Date of Patent: Sep. 5, 2006

(54) METHOD FOR FORMING FUSE INTEGRATED WITH DUAL DAMASCENE PROCESS

(75) Inventors: Ja-Young Choi, Seoul (KR); Ki-Young Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 234 days.

(21) Appl. No.: 10/787,680

(22) Filed: Feb. 25, 2004

(65) Prior Publication Data

US 2004/0171263 A1  Sep. 2, 2004

(30) Foreign Application Priority Data

Feb. 28, 2003 (KR) .................. 10-2003-0012766

(51) Int. Cl.
*H01L 21/311* (2006.01)
(52) U.S. Cl. ............... 438/700; 438/702; 438/132; 438/601
(58) Field of Classification Search ........ 438/601, 438/622, 637, 700, 702, 720, 723, 724, 132
See application file for complete search history.

(56) References Cited

U.S. PATENT DOCUMENTS

| | | | |
|---|---|---|---|
| 5,444,012 A | 8/1995 | Yoshizumi et al. | |
| 6,440,833 B1 * | 8/2002 | Lee et al. ................ | 438/601 |
| 6,677,226 B1 * | 1/2004 | Bowen et al. ........... | 438/601 |
| 6,864,124 B1 * | 3/2005 | Lee et al. ................ | 438/132 |
| 2002/0079552 A1 * | 6/2002 | Koike ..................... | 257/529 |
| 2004/0012073 A1 * | 1/2004 | Omura et al. ........... | 257/529 |
| 2005/0170635 A1 * | 8/2005 | Koike ..................... | 438/622 |
| 2005/0218476 A1 * | 10/2005 | Lee et al. ................ | 257/529 |

* cited by examiner

*Primary Examiner*—Kin-Chan Chen
(74) *Attorney, Agent, or Firm*—Marger Johnson & McCollom, P.C.

(57) ABSTRACT

A method for forming a fuse includes forming an interconnection pattern and a fuse pattern on a substrate using a damascene process. A passivation layer is formed on a surface of the substrate over the interconnection pattern and the fuse pattern. Then, the passivation layer is patterned to form a pad opening that exposes a portion of the interconnection pattern. A metal pad is formed on the interconnection pattern in the pad opening. A portion of the metal pad extends over the passivation layer. The passivation layer on the fuse pattern is partially etched to form a fuse opening.

16 Claims, 6 Drawing Sheets

Pad Region | Fuse Region

METHOD FOR FORMING FUSE INTEGRATED WITH DUAL DAMASCENE PROCESS

CROSS REFERENCE TO RELATED APPLICATIONS

This application claims priority from Korean Patent Application No. 2003-12766, filed on Feb. 28, 2003, the contents of which are hereby incorporated by reference in their entirety.

BACKGROUND OF THE INVENTION

1. Technical Field of the Invention

This disclosure relates to a method for forming interconnection of semiconductor device, and more specifically, to a method for forming a pad for inputting/outputting external signal and a fuse for selective switching of circuit.

2. Description of the Related Art

A semiconductor device includes a plurality of unit devices formed on a substrate and interconnections electrically connected to the unit devices according to the designed layout. In addition, the semiconductor device includes pads for inputting/outputting power and electrical signals in order to perform cartelistic functions, and fuses in redundancy circuits for changing modules or unit devices that fail an electrical test.

Conventional methods for forming fuses in aluminum interconnection process have been disclosed by a variety of technical literature and patent specifications. Moreover, various fuse forming processes are applied to fabricate the semiconductor. Recently, a copper dual damascene process was employed in order to achieve high-rate operation, high-quality signal output, and reduction of production cost in the fabrication of semiconductor devices. A metal such as aluminum is sometimes used instead of copper because copper is relatively difficult to form while aluminum is relatively easy.

Various methods for forming fuses of semiconductor devices are disclosed in U.S. Pat. No. 5,444,012 "METHOD FOR MANUFACTURING SEMICONDUCTOR INTEGRATED CIRCUIT DEVICE HAVING A FUSE ELEMENT", U.S. Pat. No. 6,440,833 "METHOD OF PROTECTING A COPPER PAD STRUCTURE DURING A FUSE OPENING PROCEDURE", etc.

FIGS. 1 through 3 are cross-sectional diagrams illustrating a conventional method for forming a fuse.

Referring to FIG. 1, an interconnection 12a and fuse electrodes 12b are formed on a semiconductor substrate 10. An interlayer dielectric layer 14 is formed on the semiconductor substrate 10 over the interconnection 12a and the fuse electrodes 12b. A fuse pattern 24 is formed on the interlayer dielectric layer 14. The fuse pattern 24 electrically connects a pad pattern 22 and the fuse electrodes 12b, which are connected to the interconnection 12a through the interlayer dielectric layer 14. The interconnection 12a, the fuse electrode 12b, the pad pattern 22, and the fuse pattern 24 may be formed by a conventional dual damascene process.

Referring to FIG. 2, a passivation layer 28 is formed on the pad pattern 22 and the fuse pattern 24. The passivation layer 28 may be formed of a plurality of insulating layers according to a desired device condition and process condition.

The passivation layer 28 is patterned to form a pad opening 30 over a portion of the pad pattern 22. Simultaneously, the passivation layer 28 on the fuse pattern 24 is partially etched to form a fuse opening 34. Part of the passivation layer 28 is left on the fuse pattern 24 in the fuse opening 34.

Referring to FIG. 3, a metal layer (not shown) is formed on the passivation layer 28 over the pad opening 30 and the fuse opening 34. The metal layer is patterned to form a metal pad 32p electrically connected to the interconnection 12a. As illustrated in FIG. 3, spacers 32r from the metal layer are also formed on sidewalls of the fuse opening 34. The spacers 32r may cause problems during fusing procedures that use laser or high-voltage pulses. For example, if the spacers 32r are connected along edges of the fuse opening 34, the spacer may electrically connect the fuse electrodes 12b even when the fuse pattern 24 is blown in a fusing procedure.

In addition, if the passivation layer 28 on the fuse pattern 24 suffers from over-etching while the metal pad 32p is formed, laser scattering occurs at the surface 36 of the insulating layer and sufficient energy for blowing a fuse may not be provided to the fuse pattern 24. In addition, because the pad opening 30 and the fuse opening 34 are simultaneously formed, the passivation layer 28 in the pad opening needs to be over-etched because the insulating layer should not remain on the pad pattern 22. As a result, the thickness of the remaining passivation layer 28 in the fuse opening 34 is difficult to control.

Embodiments of the invention address these and other disadvantages of the prior art.

SUMMARY OF THE INVENTION

An embodiment of the invention provides a method for forming fuses that reduces defects caused by blowing fuses during fusing procedures.

Another embodiment of the invention provides a method for forming fuses that prevents laser dispersion on a surface of the insulating layer over the fuse.

Still another embodiment of the invention provides a method for forming fuses that contributes low resistance interconnections.

Another embodiment of the invention provides a method for sequentially forming a metal pad and a fuse opening.

BRIEF DESCRIPTION OF THE DRAWINGS

The invention may be understood and its features will become apparent to those skilled in the art with reference to the accompanying drawings.

FIGS. 4A through 8A are plan diagrams illustrating a method of forming fuses by dual damascene process according to an exemplary embodiment of the invention.

FIGS. 4B through 8B are cross-sectional diagrams taken along the line A—A of FIGS. 4A through 8A, respectively.

DETAILED DESCRIPTION OF THE INVENTION

Figure 1:
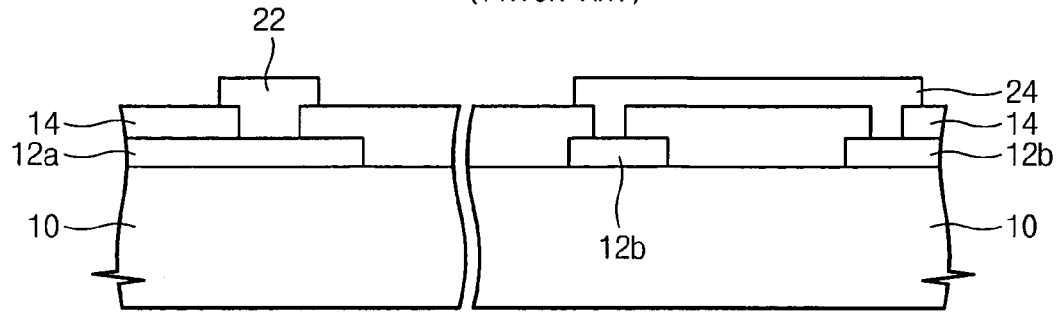
FIGS. 1 through 3 are cross-sectional diagrams illustrating a conventional method for forming fuses by dual damascene process.
Figure 2:
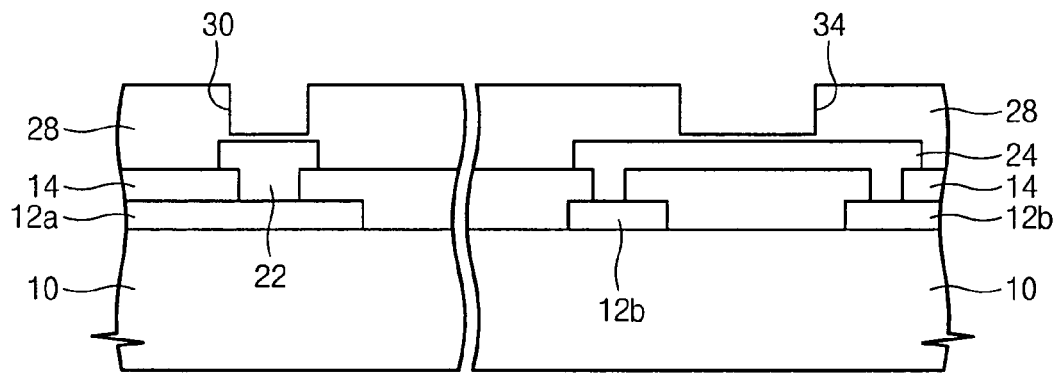
Figure 3:
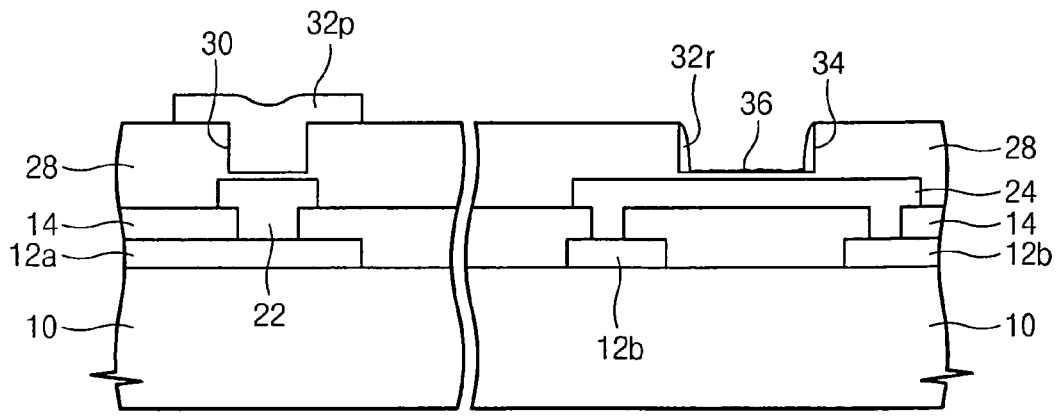

The invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

FIGS. 4A through 7A are plan diagrams illustrating a method of forming fuses by dual damascene process according to an exemplary embodiment of the invention.

FIGS. 4B through 7B are cross-sectional diagrams taken along a line A—A of FIGS. 4A through 7A, respectively.

Figure 4A:
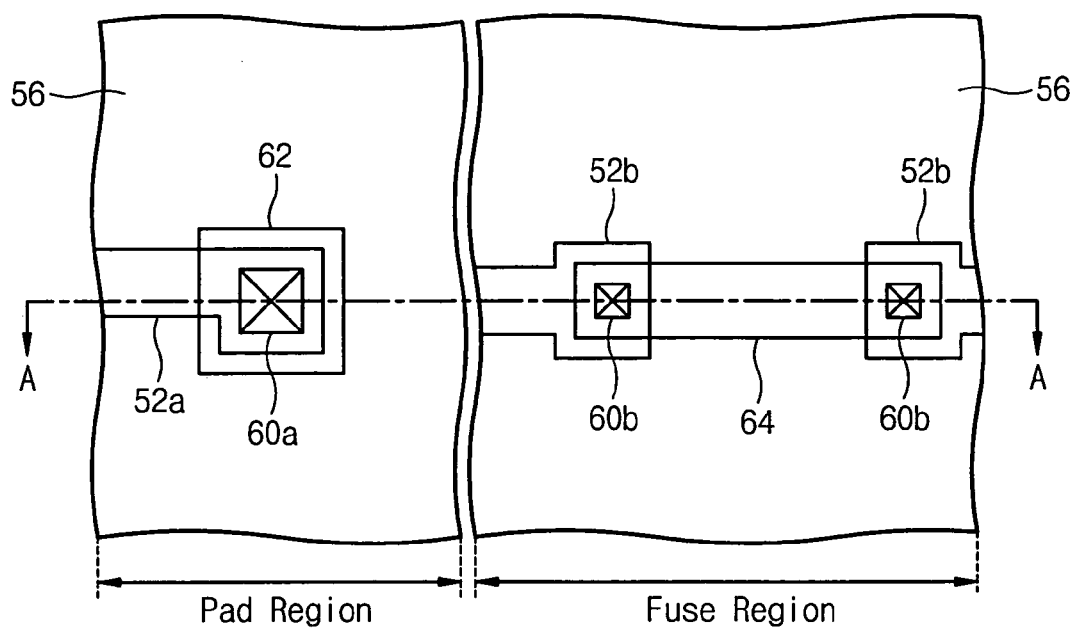
Figure 4B:
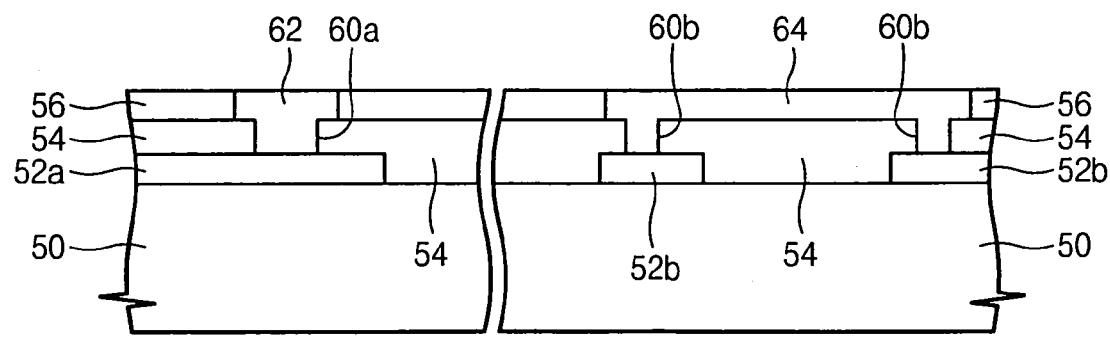

Referring to FIGS. 4A through 4B, an interconnection 52*a* and fuse electrodes 52*b* are formed on a semiconductor substrate 50 with defined pad region and fuse region. The substrate 50 includes a plurality of insulting layers. A plurality of unit devices such as transistor, resistance, capacitor, inductor etc. may be formed on the substrate 50. The interconnection 52*a* is selectively connected to or insulated from the unit devices according to layout designed as various forms on an insulating layer. The fuse electrodes 52*b* may be connected to a portion of the interconnection 52*a* or selectively connected to the unit devices in order to replace circuit, module, or unit devices that fail in electrical test. The interconnection 52*a* and the fuse electrodes 52*b* may be formed by a copper dual damascene process for simplification of fabrication process, unit-cost reduction, high transfer-rate of signal, and disturbance between adjoining interconnections.

An interlayer dielectric layer 54 is formed on the substrate with the interconnection 52*a* and the fuse electrodes 52*b*. The interlayer dielectric layer 54 includes a plurality of insulating layers (not shown). In addition, the interlayer dielectric layer 54 may be formed using a low-k dielectric layer, thereby reducing intrinsic transistor effects between interconnections.

Referring to FIGS. 4A and 4B, a mold layer 56 is formed on the interlayer dielectric layer 54 and then the mold layer 56 and the interlayer dielectric layer 54 are successively patterned to form a pad mold 60*a* corresponding to a pad pattern and a fuse mold 60*b* corresponding to a fuse pattern. The mold layer 56 may be formed of low-k dielectric layer as well as the interlayer dielectric layer 54. A pad pattern 62 is formed in the pad mold 60*a* and a fuse pattern 64 is formed in the fuse mold 60*b*. The pad pattern 62 is electrically connected to the interconnection 52*a*. Both ends of the fuse pattern 64 are electrically connected to the fuse electrode 52*b*. The pad pattern 62 and the fuse pattern 64 may be formed by a conventional metal dual damascene process. That is, an aluminum layer is formed and then polished by a chemical mechanical polishing (CMP) process. Alternately, a copper layer is formed by electroplating and then polished by a CMP process.

Figure 5A:
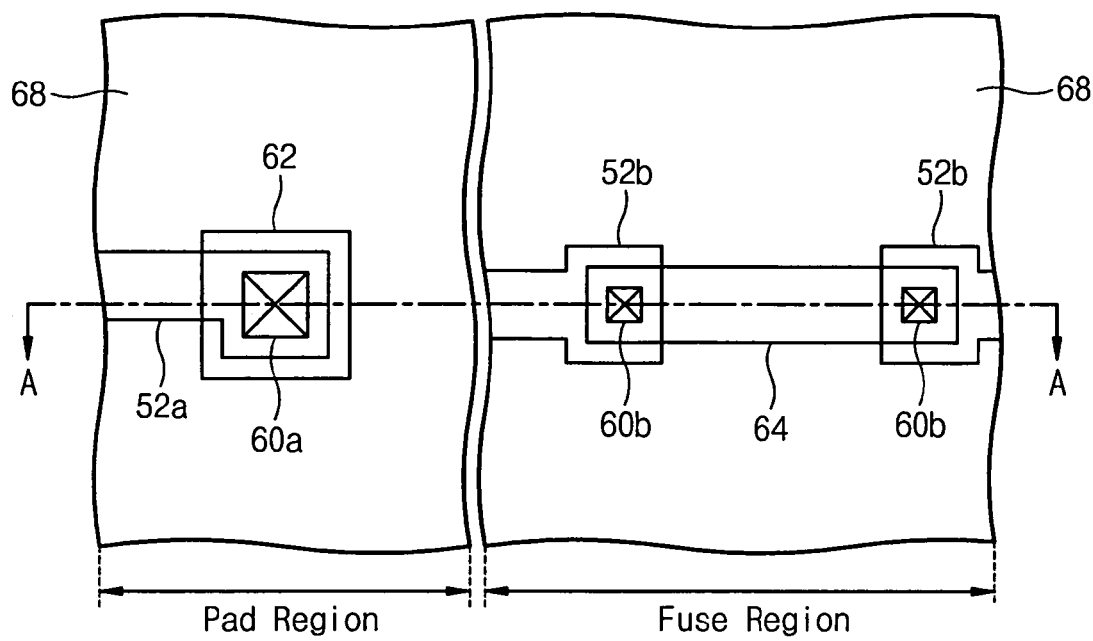
Figure 5B:
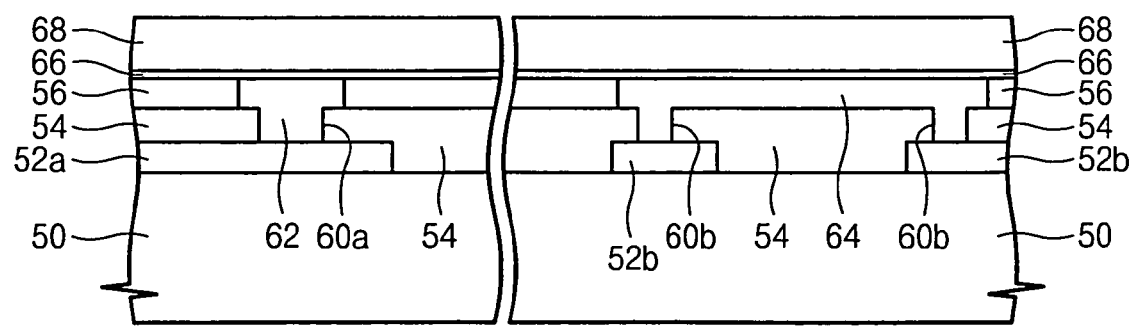

Referring to FIGS. 5A and 5B, a passivation layer 68 is formed on the mold layer 56, the pad pattern 62, and the fuse pattern 64. The passivation layer 68 may be formed of a plurality of layers and the thickness may be thousands or tens of thousands of angstroms, according to the desired device characteristics. In the case illustrated in FIGS. 5A and 5B where the fuse pattern 64 and the pad pattern 62 are formed by copper dual damascene process, a copper-diffusion prevention layer 66 may be formed first before forming the passivation layer 68. Copper has good electrical conductivity but it is easily oxidized at the surface and diffused to the oxide layer. Thus, the copper-diffusion prevention layer 66 is required. The copper-diffusion prevention layer 66 may be formed of one selected from silicon nitride, silicon oxynitride, silicon carbide, etc.

Although not illustrated in the drawings, a diffusion prevention layer or a barrier metal layer may be selectively formed between resultant structures formed of conductive material including copper and an oxide layer. In this case, the diffusion prevention layer and the barrier metal layer would serve as the copper-diffusion prevention layer 66.

Figure 6A:
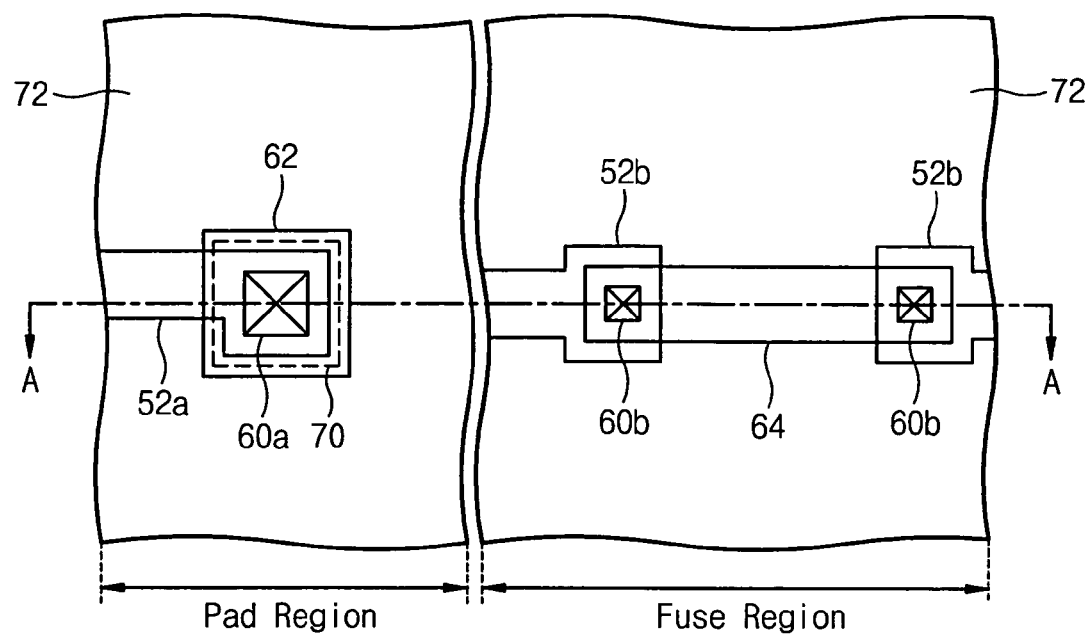
Figure 6B:
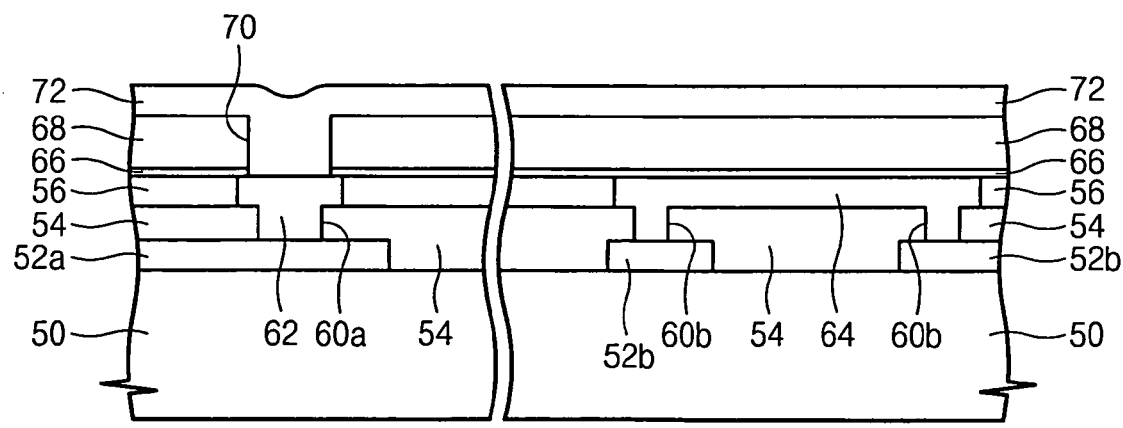

Referring to FIGS. 6A and 6B, the passivation layer 68 or the passivation layer 68 and the copper-diffusion prevention layer 66 are patterned to form a pad opening 70 exposing a portion of the pad pattern 62. A metal layer 72 is formed on the passivation layer 68. The metal layer 72 is electrically connected to the pad pattern 62 through the pad opening 70 and includes an aluminum layer. In addition, the metal layer 72 may be formed by stacking a conformal barrier metal layer and a conductive layer with high conductivity on the passivation layer 68. In the exemplary embodiment, the top layer of the metal layer 72 may be formed of material that can be used as an anti-reflecting layer during a subsequent exposure process.

Figure 7A:
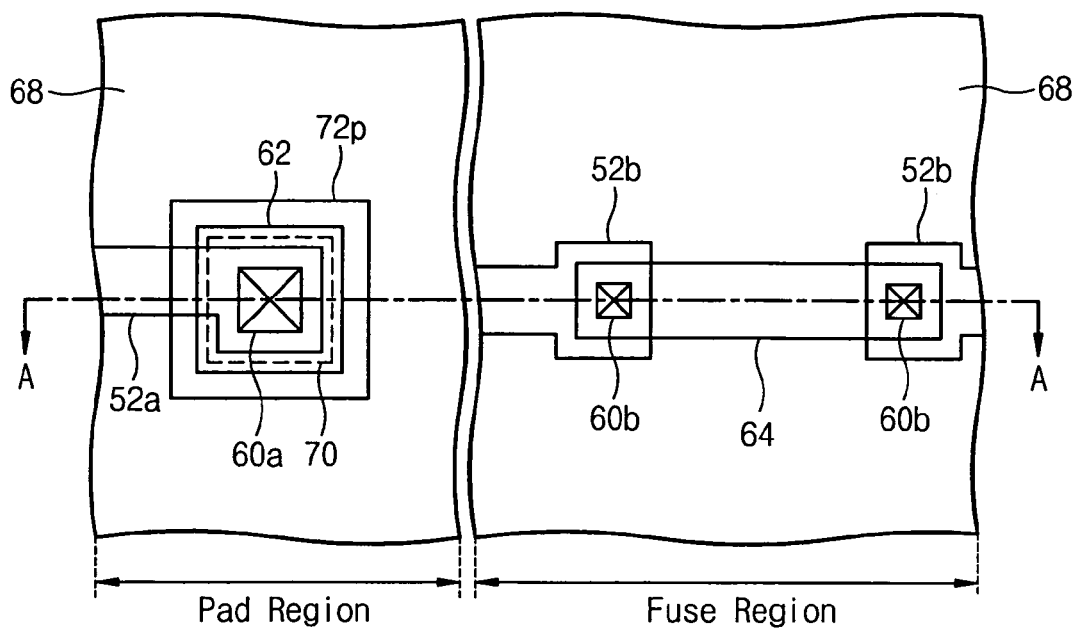
Figure 7B:
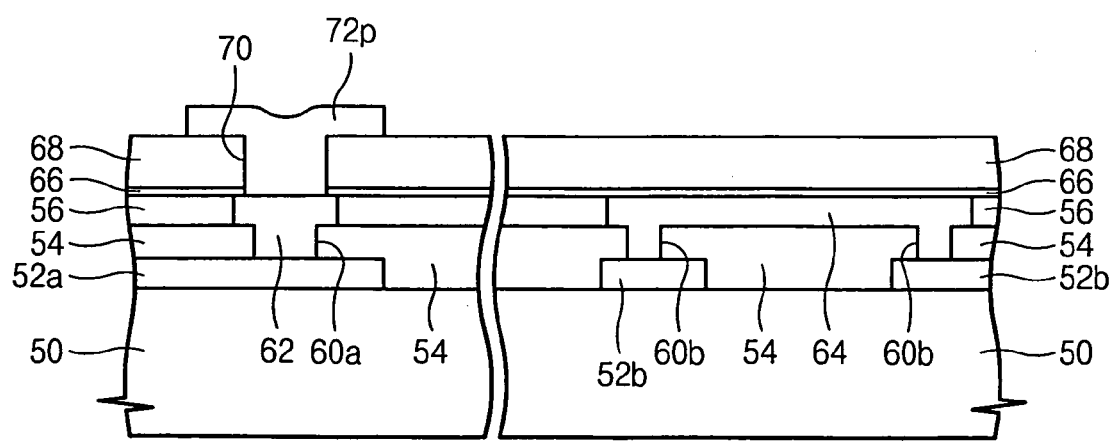

Referring to FIGS. 7A and 7B, the photolithographic process is applied to pattern the metal layer 72, thereby forming a metal pad 72*p* that is electrically connected to the pad pattern 62. The metal pad 72*p* may be a bonding pad for wire bonding in the exemplary embodiment of the invention. However, the metal pad 72*p* may also be applied to a process of forming bumpers for common flip chip bonding.

Figure 8A:
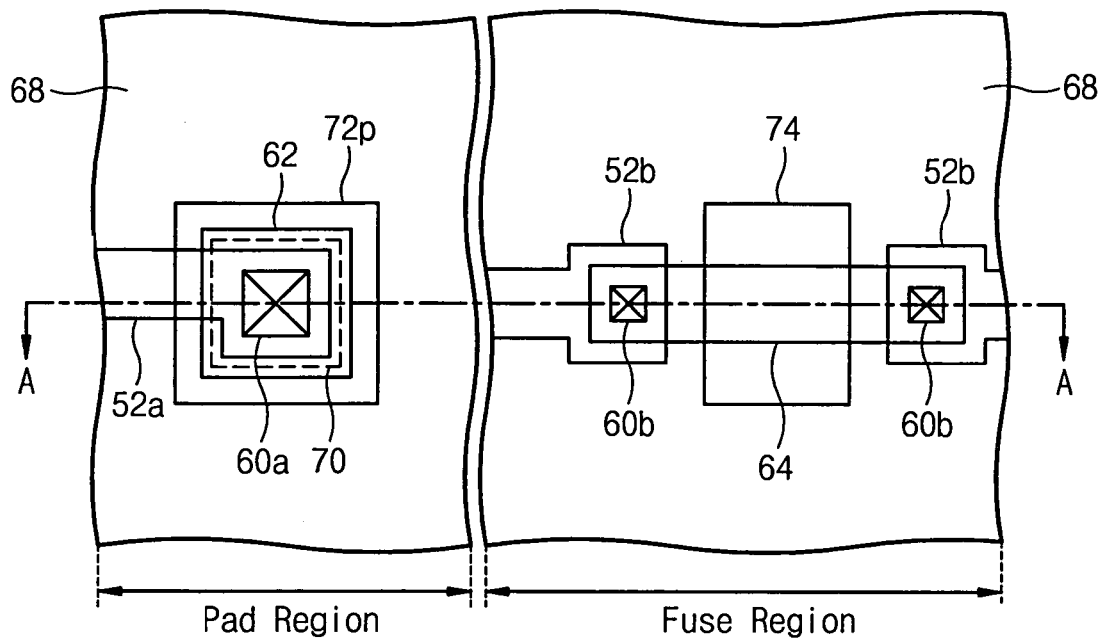
Figure 8B:
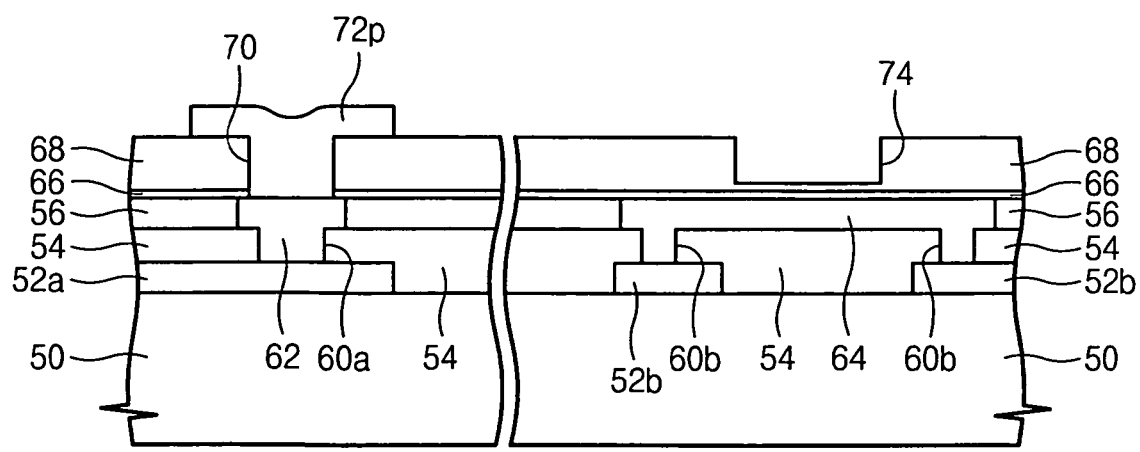

Referring to FIGS. 8A and 8B, the passivation layer 68 on the fuse pattern 64 is patterned to form a fuse opening 74. The passivation layer 68 may be partially etched and a portion of the passivation layer 68 may remain on the fuse pattern 64 in the fuse opening 74. In cases where there is a copper-diffusion prevention layer 66, the passivation layer 68 may be etched to expose the copper-diffusion prevention layer 66. A thickness of the residual insulating layer on the fuse pattern 64 in the fuse opening 74 may be controlled during fusing procedures by adjusting the intensity of the laser pulse or the high voltage pulse.

According to embodiments of the invention, a metal pad and a fuse opening are sequentially formed, such that residues of metal layer do not remain in the fuse opening and surface of an insulating layer remaining on the fuse is uniform. Therefore, fusing defects due to metal residues and laser pulse dispersion can be prevented when a fuse is blown by fusing procedures.

In addition, the fuse opening is formed in independent processes, thereby controlling the thickness of the insulating layer that remains on the fuse pattern. Thus, the invention can be employed in various devices having passivation layers of different thickness.

Embodiments of the invention will now be described in a non-limiting way.

In an embodiment of the invention, a method includes forming an interconnection pattern and a fuse pattern on a substrate using a damascene process. A passivation layer is formed on an entire surface of the substrate including the interconnection pattern and the fuse pattern. Then, the passivation layer is patterned to form a pad opening exposing a portion of the interconnection pattern. A metal pad is formed on the interconnection pattern in the pad opening. In this case, a portion of the metal pad extends on a top surface of the neighboring passivation layer. The passivation layer on the fuse pattern is partially etched to form a fuse opening.

In another embodiment of the invention, the interconnection pattern and the fuse pattern may be formed by a copper dual damascene process. Before forming the passivation layer, a copper-diffusion preventing layer may be formed. In addition, the passivation layer is formed of a plurality of insulating layers and the fuse opening may be formed by etching the entire passivation layer or a portion of the passivation layer on the fuse pattern.

In some embodiments of the invention, the metal pad may be formed of a metal layer that includes an aluminum layer.

Several embodiments of the invention have been described. It should be apparent that other additional embodiments of the invention may be evident to those of skill in the art. Thus, the invention is not limited by the embodiments described above but by the scope and spirit of the invention as defined in the claims below.

The invention claimed is:

1. A method for forming a fuse comprising:
    forming an interlayer dielectric layer on a pad region and a fuse region of a substrate;
    forming a mold layer on the interlayer dielectric;
    patterning the mold layer and the interlayer dielectric to form a pad mold in the pad region and a fuse mold in the fuse region;
    forming a pad pattern in the pad mold and a fuse pattern in the fuse mold using a damascene process, the pad pattern and the fuse pattern formed from the same layer;
    forming a copper diffusion-prevention layer on the pad pattern and the fuse pattern;
    forming a passivation layer on the copper diffusion-prevention layer;
    patterning the passivation layer and the copper diffusion-prevention layer to form a pad opening that exposes the pad pattern;
    forming a metal pad in the pad opening, the metal pad touching the pad pattern, a portion of the metal pad extending over the passivation layer; and
    after forming the metal pad, partially etching the passivation layer over the fuse pattern to form a fuse opening, the partial etching performed such that a portion of the passivation layer remains at the bottom of the fuse opening.

2. The method of claim 1, wherein forming the passivation layer comprises stacking a plurality of insulating layers.

3. The method of claim 1, wherein forming the pad pattern and the fuse pattern comprises performing a copper dual damascene process.

4. The method of claim 1, wherein the copper-diffusion prevention layer is formed of a layer selected from the group consisting of silicon nitride, silicon oxynitride, and silicon carbide.

5. The method of claim 1, wherein the copper-diffusion prevention layer is exposed by the fuse opening.

6. The method of claim 1, wherein a portion of the passivation layer is left on the copper-diffusion prevention layer when the fuse opening is formed.

7. The method as claimed in claim 1, wherein forming the metal pad comprises:
    forming a metal layer on the passivation layer with the pad opening; and
    patterning the metal layer, wherein the metal layer is electrically connected to the pad pattern through the pad opening.

8. The method as claimed in claim 7, wherein the metal layer includes an aluminum layer.

9. A method comprising:
    forming a fuse pattern and a pad pattern on a substrate, the fuse pattern and the pad pattern formed from the same layer;
    forming a diffusion prevention layer on the fuse pattern and on the pad pattern;
    forming a passivation layer in physical contact with the diffusion prevention layer;
    patterning the passivation layer and the diffusion prevention layer to form a pad opening that exposes the pad pattern;
    forming a metal pad in the pad opening, the metal pad in physical contact with the pad pattern; and
    after forming the metal pad, patterning the passivation layer to form a fuse opening over the fuse pattern, where the fuse opening does not completely penetrate the passivation layer.

10. The method of claim 9, wherein forming the fuse pattern and the pad pattern comprises performing a copper dual damascene process.

11. The method of claim 10, wherein forming the diffusion prevention layer comprises forming a copper diffusion prevention layer.

12. The method of claim 11, wherein forming the copper-diffusion prevention layer comprises forming a silicon nitride layer.

13. The method of claim 11, wherein forming the copper-diffusion prevention layer comprises forming a silicon oxynitride layer.

14. The method of claim 11, wherein forming the copper-diffusion prevention layer comprises forming a silicon carbide layer.

15. The method of claim 9, wherein forming the metal pad in the pad opening comprises:
    forming a metal layer on the passivation layer; and
    patterning the metal layer to form the metal pad, the metal pad partially extending over the passivation layer.

16. The method of claim 15, wherein forming the metal layer comprises forming an aluminum layer.

* * * * *